United States Patent
Golubchik et al.

(10) Patent No.: US 11,973,305 B2
(45) Date of Patent: Apr. 30, 2024

(54) COHERENT BEAM COMBINATION (CBC) SYSTEMS AND METHODS

(71) Applicant: RAFAEL ADVANCED DEFENSE SYSTEMS LTD., Haifa (IL)

(72) Inventors: Daniel Golubchik, Qiryat Motzkin (IL); Yehonathan Segev, Haifa (IL); David Shwa, Dovrat (IL)

(73) Assignee: RAFAEL ADVANCED DEFENSE SYSTEMS LTD., Haifa (IL)

( * ) Notice: Subject to any disclaimer, the term of this patent is extended or adjusted under 35 U.S.C. 154(b) by 771 days.

(21) Appl. No.: 17/259,933

(22) PCT Filed: Jul. 18, 2019

(86) PCT No.: PCT/IB2019/056151
§ 371 (c)(1),
(2) Date: Jan. 13, 2021

(87) PCT Pub. No.: WO2020/016824
PCT Pub. Date: Jan. 23, 2020

(65) Prior Publication Data
US 2021/0294109 A1    Sep. 23, 2021

(51) Int. Cl.
*H01S 3/13*    (2006.01)
*H01S 3/00*    (2006.01)
*H01S 3/067*    (2006.01)
*H01S 3/10*    (2006.01)
*H01S 3/23*    (2006.01)
(Continued)

(52) U.S. Cl.
CPC .......... *H01S 3/1307* (2013.01); *H01S 3/0085* (2013.01); *H01S 3/067* (2013.01);
(Continued)

(58) Field of Classification Search
CPC ...... H01S 3/1307; H01S 3/0085; H01S 3/067; H01S 3/10053; H01S 3/2308;
(Continued)

(56) References Cited

U.S. PATENT DOCUMENTS 7,058,098 B1 * 6/2006 Shay ..................... H01S 3/2383
                                                    372/29.016
7,346,085 B1 * 3/2008 Rothenberg ....... G02B 19/0057
                                                    372/29.016
(Continued)

OTHER PUBLICATIONS

Hyde Milo W. et al., "Temporal Coherence Effects on Target-Based Phasing of Laser Arrays", Journal of the Optical Society of America A, vol. 33, No. 10, Sep. 6, 2016.
(Continued)

*Primary Examiner* — Kinam Park
(74) *Attorney, Agent, or Firm* — Rivka Friedman (57) ABSTRACT

A coherent beam combination (CBC) system (10) includes an array of beam sources (12a, 12b and 12c) generating coherent beams directed towards a target (T). The phase modulators (14a, 14b and 14c) allow adjustment of relative phase offsets of the beams. A detector (16) monitors an intensity of the radiation impinging on an area of the target (T). A controller (18) receives the intensity parameter and controls a phase adjustment of the beams according to a deterministic (i.e., quantitative) measurement of a phase offset of each beam relative to a representative phase of the sum of all the other beams. This is achieved by using interferometric techniques, referred to herein as Target In-the-Loop Interferometry (TILI).

18 Claims, 4 Drawing Sheets

(51) Int. Cl.
*G01S 7/481* (2006.01)
*H01S 5/40* (2006.01)

(52) U.S. Cl.
CPC ........ *H01S 3/10053* (2013.01); *H01S 3/2308* (2013.01); *H01S 3/2383* (2013.01); *G01S 7/4815* (2013.01); *H01S 3/06737* (2013.01); *H01S 3/10092* (2013.01); *H01S 3/1305* (2013.01); *H01S 5/4012* (2013.01)

(58) Field of Classification Search
CPC ............... H01S 3/2383; H01S 3/06737; H01S 3/10092; H01S 3/1305
See application file for complete search history.

(56) References Cited

U.S. PATENT DOCUMENTS

| | | | |
|---|---|---|---|
| 7,406,220 B1* | 7/2008 | Christensen | G02B 6/032 385/27 |
| 8,731,010 B2* | 5/2014 | Messerly | H01S 3/2383 372/18 |
| 2007/0086010 A1* | 4/2007 | Rothenberg | H01S 3/1301 356/450 |
| 2009/0201575 A1* | 8/2009 | Fermann | H01S 3/06754 359/341.32 |
| 2009/0296751 A1* | 12/2009 | Kewitsch | H01S 5/042 372/18 |
| 2016/0223766 A1* | 8/2016 | White | H01S 3/1307 |
| 2019/0052045 A1* | 2/2019 | Metzger | H01S 3/1307 |

OTHER PUBLICATIONS

Shay Thomas M., "Theory of Electronically Phased Coherent Beam Combination Without a Reference Beam", Optics Express, vol. 14, No. 25, Dec. 11, 2006.

* cited by examiner

COHERENT BEAM COMBINATION (CBC) SYSTEMS AND METHODS

FIELD AND BACKGROUND OF THE INVENTION

The present invention relates to Coherent Beam Combination (CBC) systems and methods, and particularly, to systems and methods for measuring and/or correcting phase offsets between multiple beams of a CBC system.

It is known to employ CBC systems in which a plurality of coherent laser beams are combined in order to achieve power scaling of a laser source. Typical implementations employ an array of fiber lasers, each seeded by a common "seeder" oscillator, which generate beams which are directed so as to combine at or before reaching a target.

In order to achieve effective coherent combination, the phase of the different beams reaching the target must be very accurately synchronized so as to minimize phase differences between the beams. Particularly for free-space laser systems, and in particular, where the beams need to traverse significant atmospheric turbulence, rapid variations in the diffractive properties of the atmosphere renders the correction of phase offsets for the different beams challenging. The difficulty in achieving phase offset correction becomes greatly compounded as the number of beams to be combined increases.

SUMMARY OF THE INVENTION

The present invention is a coherent beam combination system and method.

According to the teachings of an embodiment of the present invention there is provided, a method of determining phase offsets of multiple beams of a coherent beam combination (CBC) device impinging on a target, the beams having associated adjustable phase modulators, the method comprising the steps of: (a) monitoring an intensity parameter that varies as a function of an intensity of the radiation impinging on the target; (b) for each of the beams, actuating the corresponding phase modulator to modulate a current phase of the transmitted beam between at least three phase states; (c) identifying variations in the intensity parameter resulting from the modulation of the current phase of each transmitted beam relative to the sum of all the other beams; and (d) calculating based on the variations a phase offset of the current phase of each beam relative to a representative phase of the sum of all the other beams.

According to a further feature of an embodiment of the present invention, the phase modulator of each beam is actuated to perform a phase correction derived from the calculated phase offset.

According to a further feature of an embodiment of the present invention, the modulating, identifying, calculating and correction are performed repeatedly at least 100 times per second.

According to a further feature of an embodiment of the present invention, the current phase of each transmitted beam is modulated at a modulation frequency, and wherein the identifying comprises identifying variations in the reflected intensity occurring at more than one harmonic of the modulation frequency.

According to a further feature of an embodiment of the present invention, the current phases of a plurality of the transmitted beams are varied simultaneously, the current phase of each of the transmitted beams being modulated at a distinct modulation frequency.

According to a further feature of an embodiment of the present invention, the current phase of each transmitted beam is modulated in a substantially continuous manner over a range of modulation frequencies encompassing the at least three phase states.

According to a further feature of an embodiment of the present invention, the current phase of each transmitted beam is modulated in a stepped manner between the at least three phase states.

According to a further feature of an embodiment of the present invention, the plurality of beams comprises at least 10 beams.

According to a further feature of an embodiment of the present invention, the intensity parameter is derived from at least one sensor sensitive to the beams located at the target.

According to a further feature of an embodiment of the present invention, the intensity parameter is derived from a sensor deployed to sense radiation that is reflected from the target.

According to a further feature of an embodiment of the present invention, the detector is located remotely from the target, and wherein the detector is associate with an optical arrangement defining an effective field of view for the detector approximating to an area of the target no greater than a diffraction-limited spot size of the CBC device beams on the target.

According to a further feature of an embodiment of the present invention, the detector is located remotely from the target, and wherein the detector shares at least one optical component with an imaging system for generating images of the target.

According to a further feature of an embodiment of the present invention, the imaging system comprises a wavefront detector, a deformable mirror and an adaptive optics controller associated with the wavefront detector and operative to control the deformable mirror so as to reduce optical distortions in the reflected radiation.

According to a further feature of an embodiment of the present invention, the method further comprises the steps of: (a) deflecting a small proportion of the multiple beams of the CBC device towards a reference photodetector and monitoring a reference intensity parameter detected by the reference photodetector; (b) identifying variations in the reference intensity parameter resulting from the modulation of the current phase of each transmitted beam relative to the sum of all the other beams; and (c) calculating based on the variations in the reference intensity parameter a device-side phase offset of the current phase of each beam relative to a representative phase of the sum of all the other beams.

There is also provided according to the teachings of an embodiment of the present invention, a coherent beam combination (CBC) system comprising: (a) an array of beam sources configured to generate a plurality of coherent beams for directing towards a target; (b) a plurality of adjustable phase modulators associated with the beam sources so as to allow adjustment of relative phase offsets of the beams; (c) a detector deployed for monitoring an intensity parameter that varies as a function of an intensity of the radiation impinging on an area of the target; and (d) a controller comprising logic circuitry, the controller being associated with the detector to receive the intensity parameter and with the adjustable phase modulators to control a phase adjustment of the beams, the controller being configured to: (i) actuate each of the phase modulators to modulate a current phase of a corresponding one of the beams between at least three phase states; (ii) identify variations in the intensity parameter resulting from the modulation of the current phase of each transmitted beam relative to the sum of all the other beams; and (iii) calculate based on the variations a phase offset of the current phase of each beam relative to a representative phase of the sum of all the other beams.

According to a further feature of an embodiment of the present invention, the controller is further configured to actuate each of the phase modulators to perform a phase correction derived from the calculated phase offset.

According to a further feature of an embodiment of the present invention, the controller is further configured to actuate the phase modulators, identify the variations and calculate the phase offsets repeatedly at least 100 times per second.

According to a further feature of an embodiment of the present invention, the controller is further configured to modulate the current phase of each transmitted beam at a modulation frequency, and to identify variations in the reflected intensity occurring at more than one harmonic of the modulation frequency.

According to a further feature of an embodiment of the present invention, the controller is further configured to vary the current phases of a plurality of the transmitted beams simultaneously, the current phase of each of the transmitted beams being modulated at a distinct modulation frequency.

According to a further feature of an embodiment of the present invention, the controller is further configured to modulate the current phase of each transmitted beam in a substantially continuous manner over a range of modulation frequencies encompassing the at least three phase states.

According to a further feature of an embodiment of the present invention, the controller is further configured to modulate the current phase of each transmitted beam in a stepped manner between the at least three phase states.

According to a further feature of an embodiment of the present invention, the array of beam sources comprises at least 10 beam sources.

According to a further feature of an embodiment of the present invention, the detector is deployed at the target.

According to a further feature of an embodiment of the present invention, the detector is deployed to sense radiation that is reflected from the target.

According to a further feature of an embodiment of the present invention, there is also provided an optical arrangement associated with the detector and configured to define an effective field of view for the detector approximating to an area of the target no greater than a diffraction-limited spot size of the coherent beams on the target.

According to a further feature of an embodiment of the present invention, the detector shares at least one optical component with an imaging system for generating images of the target.

According to a further feature of an embodiment of the present invention, the imaging system comprises a wavefront detector, a deformable mirror and an adaptive optics controller associated with the wavefront detector and operative to control the deformable mirror so as to reduce optical distortions in the reflected radiation.

According to a further feature of an embodiment of the present invention, the system further comprises: (a) a reference photodetector associated with the controller; and (b) a beam splitter deployed to deflect a small proportion of the multiple beams of the CBC device towards the reference photodetector, and wherein the controller is further configured to: (i) monitor a reference intensity parameter detected by the reference photodetector; (ii) identify variations in the reference intensity parameter resulting from the modulation of the current phase of each transmitted beam relative to the sum of all the other beams; and (iii) calculate based on the variations in the reference intensity parameter a device-side phase offset of the current phase of each beam relative to a representative phase of the sum of all the other beams.

There is also provided according to the teachings of an embodiment of the present invention, a coherent beam combination (CBC) system comprising: (a) an array of beam sources configured to generate a plurality of coherent beams for directing towards a target; (b) a plurality of adjustable phase modulators associated with the beam sources so as to allow adjustment of relative phase offsets of the beams; (c) a detector deployed for monitoring an intensity parameter that varies as a function of an intensity of the radiation impinging on an area of the target; and (d) a controller comprising logic circuitry, the controller being associated with the detector to receive the intensity parameter and with the adjustable phase modulators to control a phase adjustment of the beams, the controller being configured to actuate the adjustable phase modulators so as to maximize the intensity parameter, wherein the detector is associated a telescope arrangement for collecting radiation reflected from the target and directing the reflected radiation to the detector, the telescope arrangement comprising a wavefront detector, a deformable mirror and an adaptive optics controller, the adaptive optics controller being associated with the wavefront detector and operative to control the deformable mirror so as to reduce optical distortions in the reflected radiation.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is a coherent beam combination system and method.

The principles and operation of systems and methods according to the present invention may be better understood with reference to the drawings and the accompanying description.

Referring now to the drawings, FIGS. 1-4 illustrate various implementations of a coherent beam combination (CBC) system, generally designated 10, constructed and operative according to certain non-limiting embodiments of the present invention. In general terms, in these embodiments, the CBC system 10 includes an array of beam sources 12a, 12b and 12c configured to generate a plurality of coherent beams for directing towards a target T. A plurality of adjustable phase modulators 14a, 14b and 14c are associated with respective beam sources 12a, 12b and 12c so as to allow adjustment of relative phase offsets of the beams. Although only three beam sources and phase modulators are illustrated here for simplicity of presentation, the invention is most preferably implemented with an array containing anywhere between two and a few hundred beams, and is most typically implemented with at least 10 beam sources, and in some particularly preferred cases, in the range of 15-40 beam sources. The phase modulators are typically provided one-per-source, although it will be appreciated that one of the sources may be implemented as a fixed reference phase without adjustment, and the rest of the beams and phase offsets may be measured and/or adjusted relative to that reference phase. A detector 16 is deployed for monitoring an intensity parameter that varies as a function of an intensity of the radiation impinging on an area of the target T. A controller 18, including logic circuitry, is associated with detector 16 to receive the intensity parameter and with the adjustable phase modulators 14a, 14b and 14c to control a phase adjustment of the beams.

It has been found that a stochastic approach to correction of phase offsets between multiple beams of a CBC system (i.e., adjustment of the phase offsets incrementally in order to try to find a maximum overall intensity) often converges too slowly to be useful, particularly for large numbers of beams and/or under working conditions in which perturbations of the phase offset occur rapidly. Instead, according to one particularly preferred aspect of the present invention, the CBC system of the present invention performs a deterministic (i.e., quantitative) measurement of a phase offset of each beam relative to a representative phase of the sum of all the other beams. This is achieved by using interferometric techniques based on beam intensity impinging on the target, referred to herein as Target In-the-Loop Interferometry (TILI), as will now be detailed.

The aforementioned intensity parameter, varying as a function of the radiation intensity impinging on the target, is monitored while each phase modulator is actuated to modulate a current phase of the corresponding transmitted beam between at least three phase states, typically an initial "unmodified" phase state and two modified-phase states. The controller identifies variations in the reflected intensity parameter resulting from the modulation of the current phase of each transmitted beam relative to the sum of all the other beams, and calculates, based on those variations, a phase offset of the current phase of each beam relative to a representative phase of the sum of all the other beams.

The calculation of the phase offset for a given beam is performed using a formula based on interferometric analysis. Various analytical techniques fall within the scope of the present invention, with the details of the analysis depending on the particular form of phase modulation introduced to the transmitted beam, and the shape and reflectivity of the target. A number of different approaches may be implemented based on interferometric techniques that are well known in of themselves, typically used for analysis of two-beam combinations, as example of which is given below. According to one aspect of the present invention, it has been found that such techniques can be effectively applied to multi-beam scenarios, where each beam's phase offset is measured relative to an average or "representative" phase of the sum of the remaining beams.

In certain preferred implementations, the current phase of each transmitted beam is modulated at a modulation frequency, and variations are identified in the reflected intensity occurring at more than one harmonic of the modulation frequency. This may be the modulation frequency itself and the second harmonic (twice the modulation frequency), and/or may include one or more higher harmonics. In certain particularly preferred implementations, the current phase of each transmitted beam is modulated in a substantially continuous manner over a range of modulation frequencies encompassing the aforementioned at least three phase states. Thus, for example, the current phase of a beam may be varied according to a sinusoidal modulation. Other continuous functions, such as a saw-tooth variation, may also be used. In other implementations, discrete steps equivalent to a step function variation of the phase state may be used.

According to one preferred but non-limiting example, the controller varies the phase of each beam in a sinusoidal manner about a current central phase state (to be determined) by a phase variation modulation amplitude $\Phi_m$ at frequency $\omega$. If the amplitude of intensity variation occurring at the target at frequencies corresponding to the first two harmonics (frequencies $\omega$ and $2\omega$) are denoted $I_\omega$ and $I_{2\omega}$, the phase offset $\Phi_\omega$ of the central phase state of the beam modulated at frequency $\omega$ relative to the average phase is given by:

$$\Phi_\omega = \tan^{-1}\left[\frac{J_2(\phi_m)I_\omega}{J_1(\phi_m)I_{2\omega}}\right]$$

where $J_1$ and $J_2$ are Bessel functions. A derivation of this formula (in a different context, presented as an expression for the Kerr rotation in a modified Sagnac interferometer, where the Kerr rotation is half of the phase offset) is presented as Equation 1 in "*Modified Sagnac Interferometer For High-Sensitivity Magneto-Optic Measurements At Cryogenic Temperatures*", Xia, Jing et al., *Appl. Phys. Lett.* 89, 062508 (2006).

Since the modulation applied to each beam according to this implementation is associated with a particular modulation frequency, it is possible to modulate simultaneously the phase offset of a plurality of beams with different modulation frequencies (while avoiding overlap of harmonics), and to recover the corresponding intensity variation measurements by Fourier analysis of the measured intensity variations in the frequency domain. The different modulation frequencies are preferably chosen to lie within a range such that the highest frequency is less than twice the lower frequency, thereby avoiding overlap of the harmonics. This allows simultaneous analysis of a plurality of beams, which may be a subgroups of the total number of beams or, in certain preferred cases, all of the beams. In one non-limiting example, a range of modulation frequencies between 10 MHz and 20 MHz have been found suitable, although frequencies anywhere in the MHz to GHz range could be used. Lower modulation frequencies could also be used, but the increased measurement time would reduce the rate at which measurements can be taken using the present invention. The above technique allows very rapid determination of the phase offset of multiple beams.

In other implementations, particularly where the phase offset of each beam is modulated stepwise between its current base value and two discrete modulated values, the modulation of the different beams may be performed sequentially in order to isolate the effect of each modulation. In this case, since there is no need to transform to the frequency domain, the measurement period for each modulation state can be very brief, typically with switching rates in the range of MHz, allowing many channels to be analyzed in rapid succession. In the case of switching, each channel is preferably switched separately, thereby allowing direct sampling of the influence of the phase difference on the overall sensed intensity. This allows the use of interferometric techniques to derive the phase offset of each channel from the average of all the other beam superimposed.

In a case where one of the channels is not provided with a phase modulator, effective modulation or switching of the phase of that channel can be achieved by modulating all of the other channels simultaneously.

According to whichever approach is employed, the steps referred to so far result in determination of a quantitative value of the phase offset of each beam relative to the average phase of the summation beam. In certain cases, particularly where the system is used as a diagnostic tool or a research tool, or as a measurement tool in support of some other device, this phase offset determination may in itself be the desired outcome/output of the system. In many applications, however, the measured phase offset values are then used by the controller to perform a phase correction derived from the calculated phase offset, thereby cancelling out phase differences between the different beams impinging on the desired region of the target, and enhancing the coherent beam combination energy delivery to the target.

This process of modulating the phase of the beams, identifying corresponding variations in the measured intensity parameter, calculating the phase offset of the beam and correction of that phase offset are preferably repeated in rapid cycles, thereby correcting in real-time for dynamic variations in the operating conditions, which may result from fluctuations in the beam generating hardware or from fluctuating atmospheric conditions caused by atmospheric turbulence. In various practical implementations, rapid repetition of these cycles performed repeatedly at least 100 times per second has been found highly effective for correcting the effects of moderate to high atmospheric turbulence.

Turning now to the structural details of various implementations of the present invention in more detail, it will be understood that various details of the implementation will vary considerably according to the intended application of the device. The variety of applications may extend from a low-energy research tool for measuring high-speed variations in optical properties of turbulent media through various communications applications (medium energy) up to high-energy directed-energy weapon systems. In each case, the array of beam sources 12a, 12b and 12c is most preferably an array of fiber lasers, seeded by a common seeder oscillator 20. For high energy applications, each fiber laser is preferably rated for a power output of at least 1 kW. The principles of the invention may be used for devices operating with various different wavelengths, but is typically implemented in the near-infrared range. Seeder oscillators and fiber lasers suitable for operating in these ranges are well known in the art, and are readily commercially available.

Phase modulators 14a, 14b and 14c may be any type of phase modulator with suitable response times and low attenuation. The phase modulator is positioned after splitting the seeder, but preferably before the fiber laser in order to operate with a relatively low-power signal. Suitable phase modulators are available commercially. One suitable non-limiting example is a 10 GHz titanium indiffused Z-Cut $LiNbO_3$ phase modulator identified by model no. LN53S-FC commercially available from Thorlabs, NJ (USA).

An optics arrangement 22 directs the beams towards the target or, for a large target, towards a particular region of the target. The term "target" is used here broadly to refer to the object against which the beams are to impinge, which may be a receiver (detector) for communications applications or a target in the military sense for weapon applications. Optics arrangement 22 is shown here only schematically, but typically includes a separate collimator for each beam, and common large-aperture focusing optics for directing the beams collectively towards the target. Alternatively, separate focusing optics can be provided for each beam.

The logic circuitry of controller 18 may be implemented as suitably configured hardware using digital and/or analog processing, including but not limited to, one or more application-specific integrated circuit (ASIC), one or more field-programmable gate array (FPGA), as a general purpose computing system configured by software operating under a suitable operating system, or by any hardware/software/firmware combination configured to perform the functions described herein at a suitable rate. The controller typically also includes a data storage device and suitable input and output interfaces for controlling the phase modulators and receiving inputs from the detector(s), all as will be clear to one having ordinary skill in the art. The data processing requirements of the system, even for high rates of measurement, are not unusual, and can be handled by standard processing equipment. Specialized hardware adaptation may be required due to the relatively large number of outputs (phase modulators for each beam) which must be adjusted rapidly in parallel, which exceeds the interface capabilities of most off-the-shelf hardware, but such adaptation is readily performed by a person having ordinary skill in the art using standard components.

Figure 1:
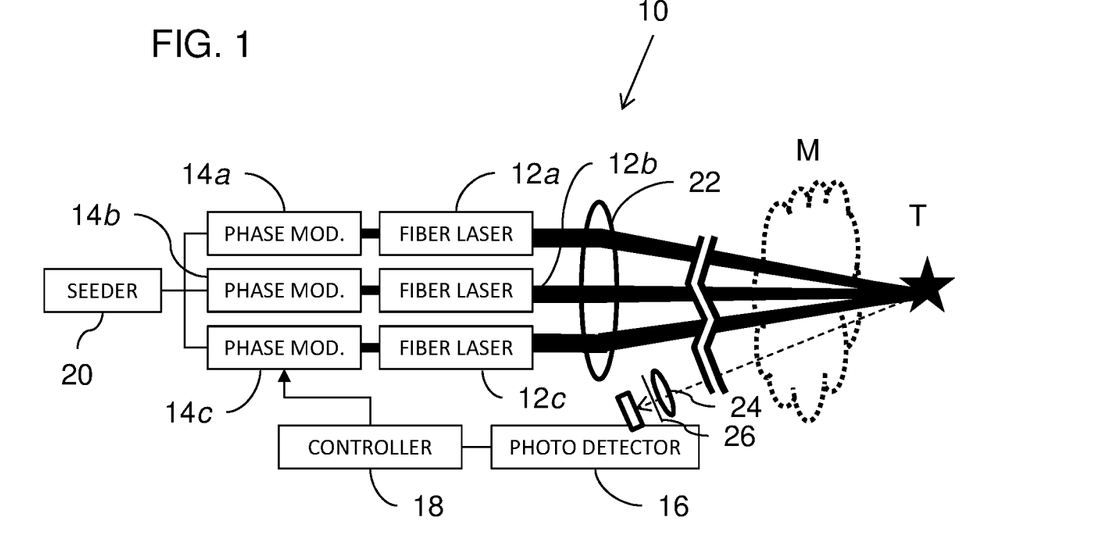
FIG. 1 is a schematic representation of a coherent beam combination system, constructed and operative according to the teachings of an implementation of a first aspect of the present invention, for measuring and/or correcting beam phase offsets based on radiation reflected from a target.
Figure 2:
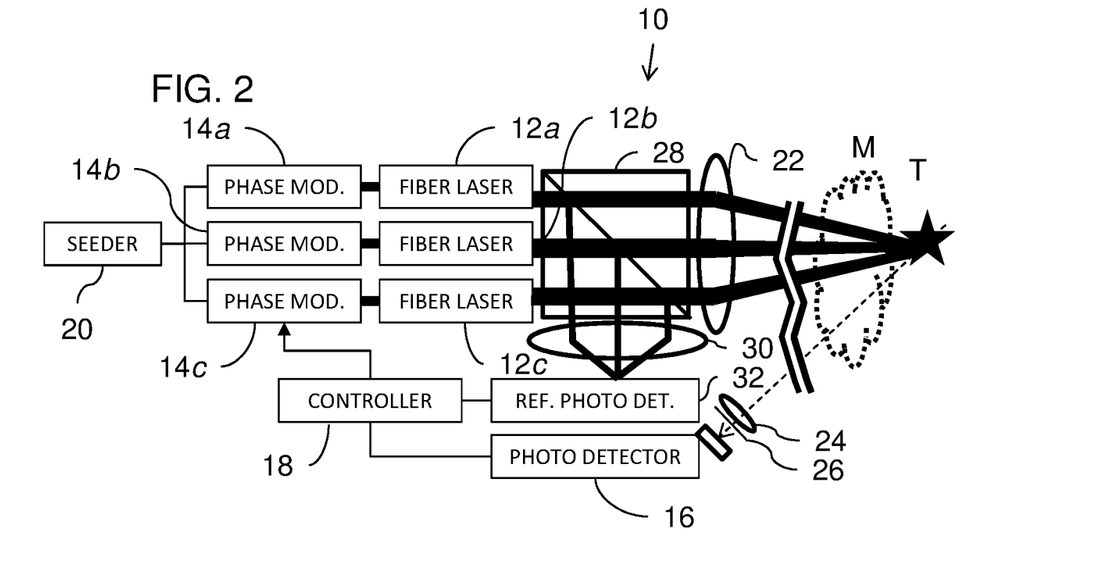
FIG. 2 is a schematic representation of a coherent beam combination system, constructed and operative according to the teachings of a variant implementation of a first aspect of the present invention, for measuring and/or correcting beam phase offsets based on radiation reflected from a target and from the transmitted beams.

The structure and deployment of photodetector 16 depends on the details of the application. In cases such as illustrated in FIGS. 1 and 2, where the CBC target is a remote object which does form part of the system design, photodetector 16 is deployed to sense radiation that is reflected from the target T. In order to ensure that the photodetector measures the correct radiation, an optical arrangement, typically in the form of a telescope, is deployed to define a field of view corresponding to the region from which the reflected radiation will arrive. The optical arrangement is represented schematically in FIGS. 1 and 2 by a lens 24, but is typically an assembly of lenses, which may be refractive or reflective, or any combination thereof, to form an appropriate telescope, as is known in the art. A narrow passband filter 26 may advantageously be deployed in the optical path to selectively pass the reflected laser illumination to the sensor while excluding ambient background radiation, thereby enhancing the signal-to-noise ratio at the photodetector. Optionally, an imaging system, for example used for aiming the CBC system, may be integrated so as to share all or part of optical arrangement 24. The imaging system receives radiation that is not limited by the narrow passband filter, but is preferably implemented with a sensor that is also sensitive to the laser wavelength in order to allow verification and correction of the CBC system aiming. The imaging system is not illustrated here, but a non-limiting example of a photodetector configuration integrated with an imaging system will be described below with reference to FIGS. 6 and 7.

FIG. 1 illustrates a basic implementation for use with a remote "non-cooperative" target, i.e., where the target is not required to carry any sensor or to play any active role in operation of the system. In this case, the CBC system generates and transmits multiple beams from fiber lasers 12a-12c via optics arrangement 22 along an optical path passing through an optically non-uniform and/or transiently varying medium M, such as the atmosphere, towards a target T. Modulation of the phase of each beam is generated under control of controller 18, preferably according to one of the schemes described above, and introduced into the transmitted beams by the adjustable phase modulators. A part of the radiation impinging on target T is reflected towards optical arrangement 24 and delivered to photodetector 16, which generates a signal (intensity parameter) indicative of an intensity of the radiation impinging on an area of target T. This area may be the entire target, in the case of a small target, or may be a selected target region of a larger target, as discussed further below. Controller 18 receives the intensity parameter and processes the variations in reflected intensity, according to the appropriate algorithm, to derive quantitative measurements of the phase offset of each beam reaching the target, and then controls adjustable phase modulators 14a, 14b and 14c to shift the current phase of each beam to bring all the beams into coherent combination. The process is repeated rapidly, thereby repeatedly fine-tuning the phase combination, and adapting to transient changes in the atmospheric conditions or other sources of phase variation which arise.

In the case of long ranges to a target, the time-of-flight of the modulated beams to the target and of the reflected radiation back to the sensor may become a limiting factor in the rate at which the measurements and adjustments can be repeated, but still allows very rapid repetition for ranges of relevance. For example, at 3 km, the time-of-flight for travel to and fro is roughly 20 microseconds. This leaves ample scope for repetition rates in excess of 100 Hz, and even up to kHz rates. If needed, sequences of phase modulation can be repeated at intervals shorter than the time-of-flight. Encoding of the transmitted signal, such as by introduction of a brief distinct sequence of off/on pulses, can be used to avoid any ambiguity as to which variations in the reflected intensity signal correspond to which modulations of the transmitted beams.

Turning now to FIG. 2, this illustrates a CBC system 10 generally similar to that of FIG. 1, with equivalent elements labeled similarly. FIG. 2 illustrates an additional optional feature according to which a small proportion of the intensity from the transmitted beams is diverted by a beam splitter 28 and combined via optics 30 onto a reference photodetector 32. Reference photodetector 32 thus generates a signal corresponding to a reference intensity parameter which is influenced by "device-side" phase differences between the beams, i.e., the phase differences originating within the hardware of the CBC system, but without the phase-altering influences of the medium M. This signal is provided to controller 18, which identifies variations in the reference intensity parameter resulting from the modulation of the current phase of each transmitted beam relative to the sum of all the other beams. These variations are then used to calculate a device-side phase offset of the current phase of each beam relative to a representative phase of the sum of all the other beams.

The ability to measure the device-side phase differences may be useful in a range of contexts. Firstly, it can be used to provide a basic level of phase correction for situations in which the target-in-the-loop phase correction may momentarily be unavailable. Additionally, by comparing the calculated phase differences for each beam between the device-side measurements and the target-reflected measurements, it is possible to ascertain analytic information about the current state of the medium M, which may be relevant to the manner in which the CBC system or other equipment is to be operated.

Figure 3:
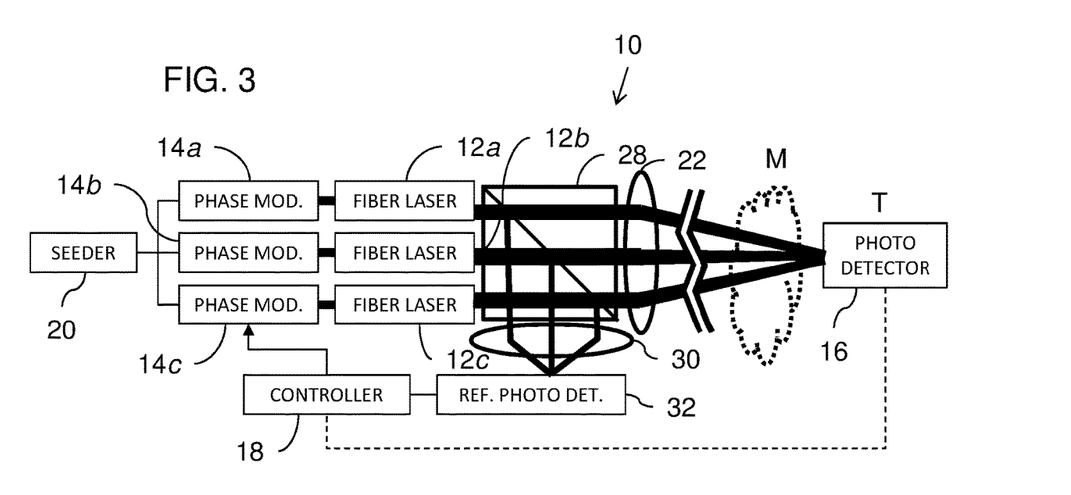
FIG. 3 is a schematic representation of a coherent beam combination system, constructed and operative according to the teachings of a further variant implementation of a first aspect of the present invention, for measuring and/or correcting beam phase offsets based on radiation sensed at a target and in the transmitted beams.

FIG. 3 illustrates a CBC system 10 which is very similar to the system of FIG. 2, but is implemented with a "cooperative target", i.e., where the "target" is part of the system, and can be provided with a target-mounted photodetector 16, connected by any suitable wired or wireless communications channel to provide its measured intensity parameter to controller 18. This configuration may be particularly useful as a scientific research tool for measuring rapidly varying optical properties of a transmission medium.

Figure 4:
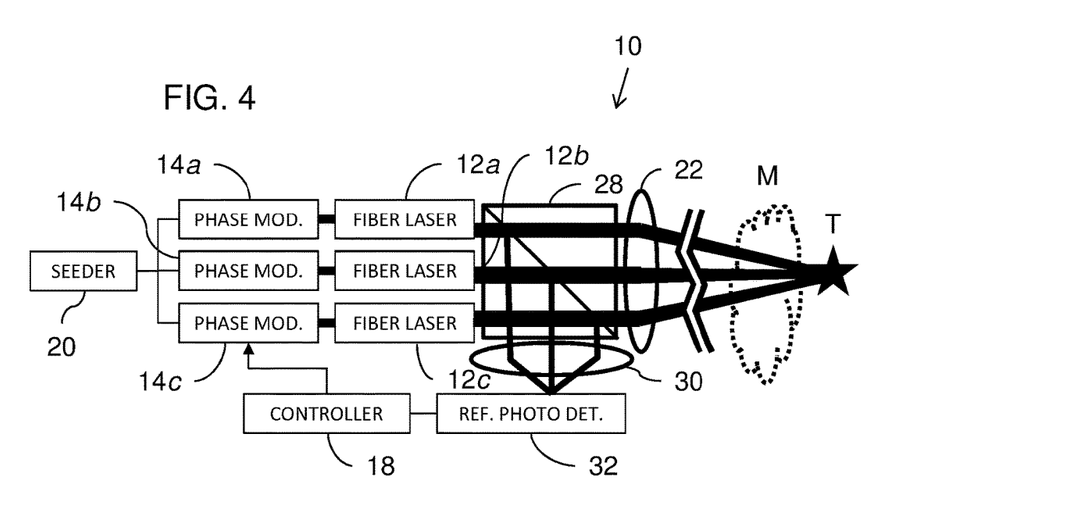
FIG. 4 is a schematic representation of a coherent beam combination system, constructed and operative according to the teachings of a further variant implementation of a first aspect of the present invention, for measuring and/or correcting beam phase offsets based on radiation from the transmitted beams.

FIG. 4 illustrates a further variant of a CBC system 10 essentially similar to that of FIGS. 2 and 3, but where the reference photodetector 32 is used for phase correction, without any feedback from the target. This configuration lacks the ability to compensate for variations due to changing optical properties of the medium M, but can maintain accurately phase-tuned beams at the transmission output of the CBC system, which may be sufficient for certain applications.

Figure 5A:
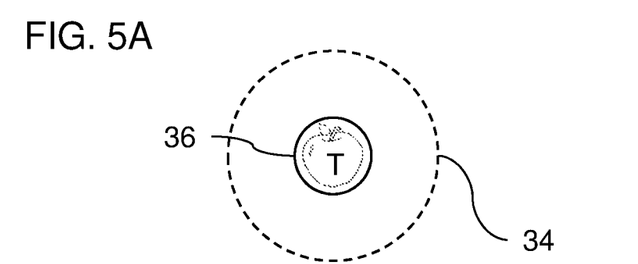
FIGS. 5A and 5B are schematic illustrations of the size of laser spots falling on a small target and on a large target, respectively.
Figure 5B:
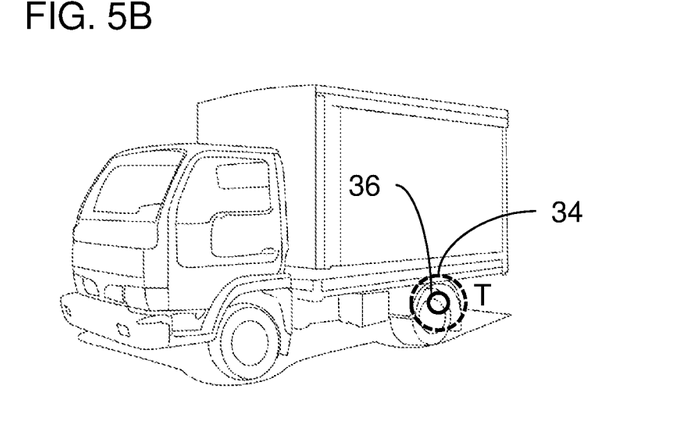

Turning now to FIGS. 5A and 5B, each individual output beam has a relatively small aperture, such that diffractive beam spread results in a relatively large illuminated region in the target plane, denoted by a dashed circle 34. The coherent beam combination of system 10, when properly phase-tuned, turns the entire array beams into a relatively large effective aperture, allowing concentration of a large proportion of the combined beam energy into a much smaller spot, designated 36. In order to provide an intensity parameter which can be used as a basis for the phase offset measurements and corrections, it is important that the signal detected by photodetector 16 corresponds to the intensity of radiation falling within the target spot 36. For small targets (FIG. 5A), where the reflective part of the target is no larger than target spot 36, the detected intensity is necessarily from within a spot no larger than target spot 36. In this case, it is preferable to use a single, relatively-large pixel detector, since it eliminates or reduces the requirements for image stabilization and increases the collection power of the detector. For applications with larger targets (FIG. 5B), it is important to collect selectively reflected radiation from within target spot 36, and not from the entire region potentially illuminated by the individual beams, in order to avoid peripherally distributed illumination contributing to the measured signals. This can be done by use of a telescope arrangement aligned with the CBC system and coordinated with deployment of a relatively-small the photodetector so that the photodetector only "sees" the small target spot region 36, corresponding to the region into which the laser spot is to be contracted. This can be achieved using a range of standard "telescope" optical arrangements.

Turning now to a second aspect of the present invention, this relates to an implementation of a targeting telescope, particularly suited to use with a CBC system, which employs adaptive optics to correct for distortions introduced by atmospheric turbulence. It should be noted that the two aspects of the present invention presented herein are of independent utility, such that the targeting telescope arrangement, while particularly suited to use with a CBC system, is not limited to use with the particular phase-offset measurement and correction techniques described thus far. Similarly, the above phase-offset measurement and correction techniques may be implemented using a conventional targeting telescope or other targeting arrangements, without requiring the adaptive optics implementation described below. Nevertheless, it should be noted that there is believed to be particular synergy to an implementation which employs both aspects of the invention together.

Figure 6:
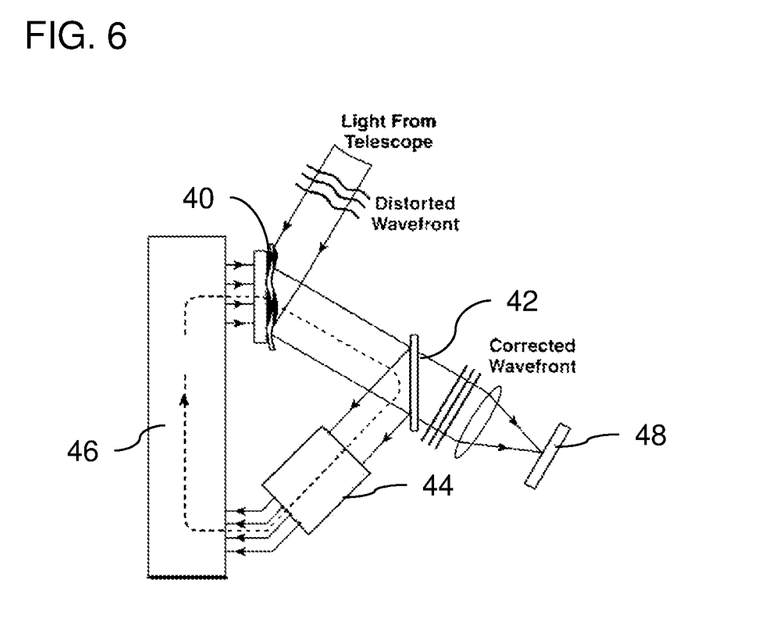
FIG. 6 illustrates schematically a telescope arrangement including adaptive optics to correct wavefront distortions.

Referring now to FIG. 6, there is shown schematically an adaptive optics arrangement for correcting distortions in an image received via a telescope. Light from a telescope arrangement (not shown) is reflected from an adaptive optical element, such as a deformable mirror 40, which typically has a reflective surface which can be selectively deformed by a plurality of actuators. Deformable mirror 40 can be implemented using any suitable deformable mirror technology including, but not limited to, MEMS actuated mirrors, electrostatically actuated mirror membranes, piezoelectric actuated mirrors and magnetic-actuated mirrors. The reflected light is divided by a beam splitter 42 from which part of the light passes to a wavefront sensor 44, such as a Shack-Hartmann wavefront sensor, which measures distortion of the wavefront. A control system 46 analyzes the wavefront distortions reaching the wavefront sensor 44 and dynamically adjusts deformable mirror 40 so as to reduce the wavefront distortions. The rest of the light emerging from beam splitter 42 is directed towards an imaging system 48 and/or other sensors, according to the application. All of the above components, and the processing required to provide wavefront correction, are per se well known, and can readily be implemented by a person of ordinary skill in the art.

Figure 7:
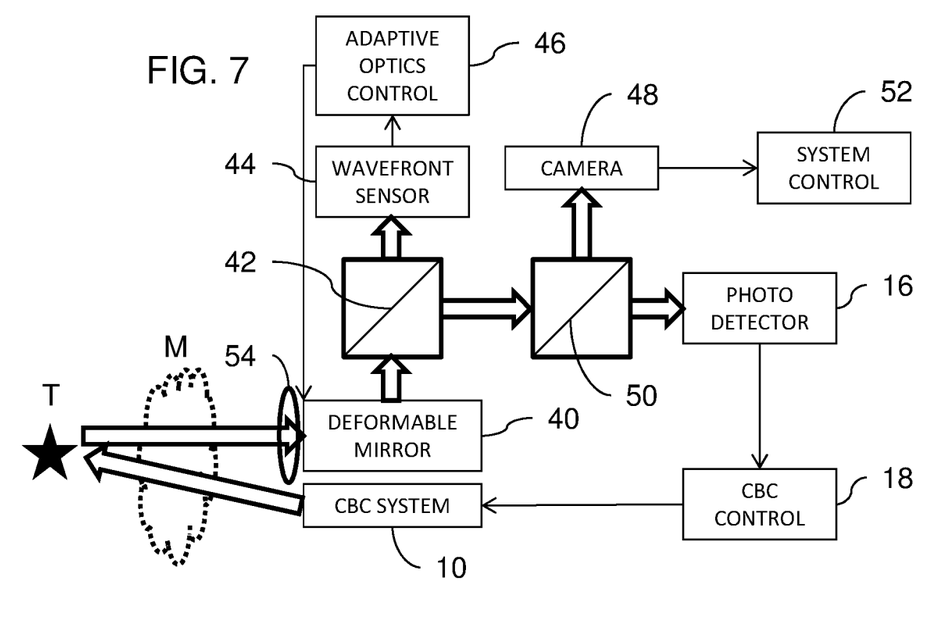
FIG. 7 is a schematic representation of a coherent beam combination system, constructed and operative according to the teachings of an implementation of a second aspect of the present invention, integrating a telescope arrangement with adaptive optics into a coherent beam combination system.

FIG. 7 illustrates a preferred implementation of such an adaptive optics arrangement in the context of a CBC system. A telescope, represented schematically by a lens 54, receives light from a target T that has passed through a medium M which introduces optical distortions. The light from the telescope is directed from deformable mirror 40 through a beamsplitter 42 to wavefront sensor 44, the output of which is processed by adaptive optics control system 46 to provide closed-loop feedback to adjust deformable mirror 40, all as already described. The other channel from beamsplitter 42 here passes to a second beamsplitter 50 which directs part of the light to an imaging sensor, camera 48, and part to photodetector 16, which senses the intensity of the CBC laser spot on the target for processing by CBC controller 18 which operates the CBC system 10. The various CBC-related components may be otherwise conventional components, but are most preferably implemented according to the teachings of the first aspect of the invention as described above with reference to FIGS. 1 and 2. An overall control system 52 receives the images from camera 48 to control the operation of the system, such as target selection, correction of aiming etc.

It should be noted that CBC and adaptive optics based on wavefront sensing are typically regarded as competing approaches for compensating for optical disruptions due to atmospheric conditions. The combination of CBC and wavefront sensing as provided by this aspect of the present invention is believed to provide particular synergism through which each technology is employed in roles particularly suited to its characteristics. Specifically, for targets which are large compared to the diffraction-limited spot size of the CBC system, and are "non-cooperative" as defined herein, the system function can be subdivided into two parts: optimization of the laser transmission from the system to the target; and image correction from the target back to the system. In wavefront sensing, in principle, both problems are solved simultaneously. In practice, however, there are no actuators (deformable mirrors) that are both suitable for use with high power lasers and sufficiently fast. The technique wavefront-sensing technology is therefore limited to low power or low speed applications. CBC on the other hand can be implemented with extremely fast actuators, and is applicable for high powers. However, CBC is unable to solve the image correction problem. The system architecture proposed according to this aspect of the present invention combines CBC technology for correcting the laser transmission with adaptive optics based on wavefront sensing for the target imaging/feedback side of the control loop, thereby achieving enhanced system performance that combines high power and rapid correction.

The subdivision of the control systems into separate elements 18, 46 and 52 is shown here according to a functional subdivision. It should be noted however that these functions may be performed by processing systems or other logic circuitry hardware which can be subdivided in any desired manner, with one or more function being performed by a single processing system, or by a single function being performed by separate distributed processing systems. In some cases, certain processing and control functions may be performed remotely.

To the extent that the appended claims have been drafted without multiple dependencies, this has been done only to accommodate formal requirements in jurisdictions which do not allow such multiple dependencies. It should be noted that all possible combinations of features which would be implied by rendering the claims multiply dependent are explicitly envisaged and should be considered part of the invention.

It will be appreciated that the above descriptions are intended only to serve as examples, and that many other embodiments are possible within the scope of the present invention as defined in the appended claims.

What is claimed is:

1. A method of determining phase offsets of multiple transmitted beams of a coherent beam combination (CBC) device impinging on a target, each of the transmitted beams being transmitted by an associated beam source having a corresponding adjustable phase modulator, the method comprising:
   (a) for each of said transmitted beams, actuating the corresponding adjustable phase modulator to modulate a current phase of the transmitted beam between at least three phase states;
   (b) while each adjustable phase modulator is actuated, monitoring an intensity parameter that varies as a function of an intensity of radiation of the transmitted beam impinging on the target;
   (c) identifying variations in the intensity parameter resulting from the modulation of the current phase of each transmitted beam relative to the sum of all the other transmitted beams; and (d) calculating based on said variations a phase offset of the current phase of each transmitted beam relative to a representative phase of the sum of all the other transmitted beams.

2. The method of claim 1, further comprising actuating the corresponding adjustable phase modulator of each transmitted beam to perform a phase correction derived from the calculated phase offset.

3. The method of claim 1, wherein the current phase of each transmitted beam is modulated at a modulation frequency, and wherein said identifying comprises identifying variations in the reflected intensity occurring at more than one harmonic of said modulation frequency.

4. The method of claim 1, wherein the current phases of a plurality of the transmitted beams are varied simultaneously, the current phase of each of said transmitted beams being modulated at a distinct modulation frequency.

5. The method of claim 1, wherein the current phase of each transmitted beam is modulated in a manner selected from the group consisting of: a continuous manner over a range of modulation frequencies encompassing said at least three phase states, and a stepped manner between said at least three phase states.

6. The method of claim 1, wherein the intensity parameter is derived from at least one sensor, sensitive to the transmitted beams, located at the target.

7. The method of claim 1, wherein the intensity parameter is derived from a detector deployed to sense radiation that is reflected from the target.

8. The method of claim 7, wherein the detector is located remotely from the target, and wherein the detector is associate with an optical arrangement defining an effective field of view for the detector approximating to an area of the target no greater than a diffraction-limited spot size of the CBC device beams on the target.

9. A coherent beam combination (CBC) system comprising:
(a) an array of beam sources configured to generate a plurality of coherent beams and transmit the plurality of coherent beams towards a target;
(b) a plurality of adjustable phase modulators associated with said array of beam sources so as to allow adjustment of relative phase offsets of said transmitted coherent beams;
(c) a detector deployed for monitoring an intensity parameter that varies as a function of an intensity of radiation of said transmitted coherent beams impinging on an area of the target; and
(d) a controller comprising logic circuitry, said controller being associated with said detector to receive said intensity parameter and with said adjustable phase modulators to control a phase adjustment of said transmitted coherent beams, said controller being configured to:
(i) actuate each of said adjustable phase modulators to modulate a current phase of a corresponding one of said transmitted coherent beams between at least three phase states;
(ii) identify variations in the intensity parameter resulting from the modulation of the current phase of each transmitted coherent beam relative to the sum of all the other transmitted coherent beams; and
(iii) calculate based on said variations a phase offset of the current phase of each transmitted coherent beam relative to a representative phase of the sum of all the other transmitted coherent beams.

10. The system of claim 9, wherein said controller is further configured to actuate each of said adjustable phase modulators to perform a phase correction derived from the calculated phase offset.

11. The system of claim 9, wherein said controller is further configured to modulate the current phase of each transmitted beam at a modulation frequency, and to identify variations in the reflected intensity occurring at more than one harmonic of said modulation frequency.

12. The system of claim 9, wherein said controller is further configured to vary the current phases of a plurality of the transmitted coherent beams simultaneously, the current phase of each of said transmitted coherent beams being modulated at a distinct modulation frequency.

13. The system of claim 9, wherein said controller is further configured to modulate the current phase of each transmitted coherent beam in a manner selected from the group consisting of: a continuous manner over a range of modulation frequencies encompassing said at least three phase states, and a stepped manner between said at least three phase states.

14. The system of claim 9, wherein said detector is deployed at the target.

15. The system of claim 9, wherein said detector is deployed to sense radiation that is reflected from the target.

16. The system of claim 15, further comprising an optical arrangement associated with the detector and configured to define an effective field of view for the detector approximating to an area of the target no greater than a diffraction-limited spot size of the coherent beams on the target.

17. The method of claim 1, wherein the representative is an average phase of the sum of all the other transmitted beams.

18. The system of claim 9, wherein the representative is an average phase of the sum of all the other transmitted beams.

* * * * *